(12) United States Patent
Hussell

(10) Patent No.: US 10,651,351 B1
(45) Date of Patent: May 12, 2020

(54) LIGHT EMITTING DIODE PACKAGES

(71) Applicant: Cree, Inc., Durham, NC (US)

(72) Inventor: Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/189,195

(22) Filed: Nov. 13, 2018

(51) Int. Cl.
| | |
|---|---|
| *H01L 33/50* | (2010.01) |
| *H01L 33/60* | (2010.01) |
| *H01L 33/48* | (2010.01) |
| *H01L 33/62* | (2010.01) |

(52) U.S. Cl.
CPC .......... *H01L 33/505* (2013.01); *H01L 33/486* (2013.01); *H01L 33/60* (2013.01); *H01L 33/62* (2013.01); *H01L 2933/0033* (2013.01); *H01L 2933/0041* (2013.01); *H01L 2933/0066* (2013.01)

(58) Field of Classification Search
CPC .............................. G02B 6/0023; H01L 33/502
See application file for complete search history.

(56) References Cited

U.S. PATENT DOCUMENTS

| | | | |
|---|---|---|---|
| 8,866,169 | B2 | 10/2014 | Emerson et al. |
| 9,070,850 | B2 | 6/2015 | Keller et al. |
| 9,887,327 | B2 | 2/2018 | Reiherzer et al. |
| 2009/0057690 | A1 | 3/2009 | Chakraborty |
| 2010/0201916 | A1* | 8/2010 | Bierhuizen .......... G02B 6/0018 349/62 |
| 2015/0179903 | A1 | 6/2015 | Pun et al. |
| 2016/0293811 | A1 | 10/2016 | Hussell et al. |
| 2017/0141275 | A1 | 5/2017 | Kim et al. |
| 2017/0175980 | A1* | 6/2017 | Omori .................... H01L 25/04 |
| 2017/0254518 | A1* | 9/2017 | Vasylyev .............. F21V 17/007 |

(Continued)

FOREIGN PATENT DOCUMENTS

| | | |
|---|---|---|
| EP | 1533851 A2 | 5/2005 |
| WO | 2007141763 A1 | 12/2007 |
| WO | 2015011590 | 1/2015 |

OTHER PUBLICATIONS

Author Unknown, "CREE® XLamp® XP-G LEDs," Product Family Data Sheet CLD-DS20 REV 15D, 2009-2017, Cree Inc., 27 pages.

(Continued)

*Primary Examiner* — Thomas L Dickey
(74) *Attorney, Agent, or Firm* — Withrow & Terranova, P.L.L.C.

(57) ABSTRACT

Solid-state lighting devices including light-emitting diodes (LEDs) and more particularly LED packages are disclosed. A light-altering material may be provided in particular configurations within an LED package to redirect light toward a primary emission direction. The light-altering material may be arranged on any of a first face, a second face, or a plurality of sidewalls of an LED chip in the LED package. In certain embodiments, a lumiphoric material may be arranged on one or more of the sidewalls. A superstrate may be arranged to mechanically support the LED chip from the first face. The light-altering material may be arranged on or dispersed within the superstrate. In certain embodiments, the primary emission direction of the LED package is substantially parallel to the second face of the LED chip in the LED package. An overall thickness or height of the LED package may be less than or equal to 0.25 mm.

32 Claims, 12 Drawing Sheets

(56) References Cited

U.S. PATENT DOCUMENTS

2018/0076368 A1    3/2018  Hussell
2018/0254605 A1*   9/2018  Wojcik ................ H01S 5/02216

OTHER PUBLICATIONS

International Search Report and Written Opinion for International Patent Application No. PCT/US2019/059473, dated Jan. 24, 2020, 17 pages.

* cited by examiner

LIGHT EMITTING DIODE PACKAGES

FIELD OF THE DISCLOSURE

The present disclosure relates to solid-state lighting devices including light-emitting diodes, light-emitting diode devices, and light-emitting diode packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination and various other applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from epitaxial layers of silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in a direction of the desired transmission of light. In a typical LED package 10 illustrated in FIG. 1, a single LED chip 12 is mounted on a reflective cup 14 by means of a solder bond or conductive epoxy. One or more wire bonds 16 can connect the ohmic contacts of the LED chip 12 to leads 18A and/or 18B, which may be attached to or integral with the reflective cup 14. The reflective cup 14 may be filled with an encapsulant material 20, which may contain a wavelength conversion material such as a phosphor. At least some light emitted by the LED chip 12 at a first wavelength spectrum may be absorbed by the phosphor, which may responsively emit light at a second wavelength spectrum. The entire assembly is then encapsulated in a clear protective resin 22, which may be molded in the shape of a lens to direct the light emitted from the LED chip 12 in a direction 24 that is predominantly perpendicular to a surface of the reflective cup 14 where the LED chip 12 is mounted.

FIG. 2 shows another typical LED package 26 in which one or more LED chips 28 can be mounted onto a carrier such as a printed circuit board (PCB) carrier, substrate, or submount 30. A metal reflector 32 mounted on the submount 30 surrounds the one or more LED chips 28 and reflects light emitted by the one or more LED chips 28 in a direction 34 predominantly perpendicular to a surface of the submount 30 on which the one or more LED chips 28 is mounted. One or more wire bond connections 36 are made between ohmic contacts on the one or more LED chips 28 and electrical traces 38A, 38B on the submount 30. The mounted one or more LED chips 28 are then covered with an encapsulant 40, which may provide environmental and mechanical protection to the LED chip(s) 28 while also acting as a lens.

FIG. 3 shows another typical LED package 42 in which an LED chip 44 can be mounted on a submount 46 with a hemispheric lens 48 formed over it. The LED chip 44 can be coated by a conversion material that can convert all or most of the light from the LED chip 44. The hemispheric lens 48 is arranged to reduce total internal reflection of light. As a result, an increased amount of LED light that reaches the surface of the lens 48 transmits through the lens 48 on a first pass. Additionally, the lens 48 can be useful for directing light emission from the LED chip 44 in a desired emission pattern toward a direction 50 that is predominantly perpendicular to a surface of the submount 46 on which the LED chip 44 is mounted.

FIG. 4 shows another typical LED package 52 that is arranged to have primary light emission in a direction 54 that is predominantly parallel to a surface 56 on which the LED package 52 is mounted. The LED package 52 typically includes an LED chip 58 mounted on a submount 60. In order to have the primary light emission in the direction 54, the LED package 52 is mounted on its side in reference to the chip orientation, which is sometimes referred to as a sidelooker or side view LED. In this manner, the direction 54 is predominantly perpendicular to a surface of the submount 60 on which the LED chip 58 is mounted. In this regard, each of the LED packages 10, 26, 42, and 52 of FIGS. 1-4 has a predominant emission direction that is centered along or near the normal of the LED chip mounting surface as well as epitaxial layers within the LED chips.

FIG. 5 is a plot representing a typical spatial distribution for an emission pattern of a conventional LED package. The x-axis represents a viewing angle in degrees as measured from a direction normal to a primary emission face of an LED chip of the conventional LED package. For example, 0° is perpendicular to the primary emission face. The y-axis represents relative luminous intensity for a given viewing angle. As illustrated, the highest luminous intensity percentages are centered along a direction that is predominantly perpendicular to the primary emission face of the LED chip, which is also predominantly perpendicular to the surface on which the LED chip is mounted. In this manner, the conventional LED packages as previously described, are all configured to have the primary emission faces of the LED chips oriented predominantly perpendicular to primary emission directions of the LED packages.

The art continues to seek improved LEDs and solid-state lighting devices having reduced optical losses and providing desirable illumination characteristics capable of overcoming challenges associated with conventional lighting devices.

SUMMARY

The present disclosure relates to solid-state lighting devices including light-emitting diodes (LEDs) and more particularly to LED devices, or LED packages. A light-altering material may be provided in particular configurations within an LED package to redirect light toward a primary emission direction. The light-altering material may be arranged on any of a first face, a second face, or a plurality of sidewalls of an LED chip in the LED package. In certain embodiments, a lumiphoric material may be arranged on one or more sidewalls of the plurality of sidewalls of the LED chip. In certain embodiments, a superstrate is arranged to mechanically support the LED chip from the first face.

The light-altering material may be arranged on or dispersed within the superstrate. In certain embodiments, the primary emission direction of the LED package is substantially parallel to the second face of the LED chip in the LED package. An overall thickness or height of the LED package may be less than or equal to 0.25 mm.

In one aspect, an LED package, includes one or more LED chips comprising a first face, a second face, and a plurality of sidewalls therebetween; and a light-altering material that surrounds the first face, the second face, and at least one sidewall of the plurality of sidewalls. In certain embodiments, a primary emission direction of the LED package is substantially parallel to the second face. The light-altering material may surround the first face, the second face, and at least three sidewalls of the plurality of sidewalls. Any material that is on the first face or on the second face may be devoid of a lumiphoric material. In certain embodiments, the light-altering material is continuous around the first face, the second face, and at least one sidewall. In certain embodiments, the light-altering material comprises a thinned light-altering material through which a portion of the one or more LED chips may be electrically connected. In certain embodiments, the LED package is configured to provide illumination to the edge of a light guide in a lighting fixture.

In another aspect, an LED package includes one or more LED chips comprising a first face, a second face, and a plurality of sidewalls therebetween, wherein the one or more LED chips are mounted in the LED package on either the first face or the second face and a primary emission direction of the LED package is substantially parallel to the second face. The LED package may further comprise a first light-altering material substantially covering the first face; and a lumiphoric material arranged on a first sidewall of the plurality of sidewalls. The LED package may further comprise a second light-altering material on the second face. In certain embodiments, the first light-altering material extends toward the second light-altering material along at least one sidewall of the plurality of sidewalls. The first light-altering material may surround the one or more LED chips on three sidewalls of the plurality of sidewalls. In certain embodiments, the first light-altering material comprises at least one of a light-reflective particle, a light-refractive particle, or an opaque particle. The LED package may further comprise a superstrate configured to mechanically support the one or more LED chips from the first face. In certain embodiments, the superstrate comprises a first light-altering material as a dispersion of particles. In other embodiments, a first light-altering material is arranged in one or more layers on the superstrate. In certain embodiments, the LED package further comprises a package anode pad and a package cathode pad arranged to electrically connect with the LED chip from the second face. The package anode pad and the package cathode pad may be electrically connected with a corresponding chip anode pad and a corresponding chip cathode pad of the LED chip. In certain embodiments, the LED package is configured as a surface mount device having an overall thickness in a range of about 0.06 mm to about 0.25 mm. The LED package may further comprise a submount wherein the one or more LED chips are mechanically attached to the submount from the second face of the one or more LED chips. In certain embodiments, the LED package further comprises a package anode pad and a package cathode pad that are electrically connected to the one or more LED chips by one or more traces on a surface of the submount and a plurality of vias that extend through the submount. The LED package may further comprise one or more wirebonds that are electrically connected with the one or more LED chips, wherein the one or more wirebonds extend into a first light-altering material.

In another aspect, an LED package includes an LED chip comprising a first face, a second face, and a plurality of sidewalls therebetween; a superstrate configured to mechanically support the LED chip from the first face; a chip anode pad and a chip cathode pad on the second face; and a package anode pad and a package cathode pad arranged to electrically connect with the chip anode pad and the chip cathode pad from the second face wherein a primary emission direction of the LED package is substantially parallel to the second face. In certain embodiments, an overall thickness of the LED package is in a range of about 0.06 mm to about 0.25 mm. The superstrate may comprise a light-altering material as a dispersion of particles. The LED package may further comprise a light-altering material arranged in one or more layers on the superstrate.

In another aspect, a method of forming a light emitting diode (LED) package comprises providing an LED chip comprising a first face, a second face, and a plurality of sidewalls therebetween; and mounting the second face of the LED chip to a surface of the LED package, wherein a primary emission direction of the LED package is substantially parallel to the second face. The method may further comprise forming an optical material to cover the LED chip and removing a portion of the optical material over the LED chip. The method may further comprise forming one or more electrically conductive paths on the LED chip, wherein the one or more electrically conductive paths comprises at least one of an electrically conductive pedestal, a bump bond, a solder material, a wire, or a via. The method may further comprise forming a light-altering material to cover the optical material, the LED chip and the one or more electrically conductive paths. The method may further comprise removing a portion of the light-altering material to expose the one or more electrically conductive paths.

In another aspect, a method includes mounting or attaching a plurality of LED chips on a common superstrate that includes a first light-altering material; forming an optical material that may include one or more lumiphoric materials on the plurality of LED chips and the superstrate; forming a second light-altering material on the optical material and the plurality of LED chips; forming electrical contacts for an LED package; and singulating individual LED packages. In certain embodiments, the second light-altering material may be omitted.

In another aspect, any of the foregoing aspects, and/or various separate aspects and features as described herein, may include a plurality of individual LED chips within each LED package.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
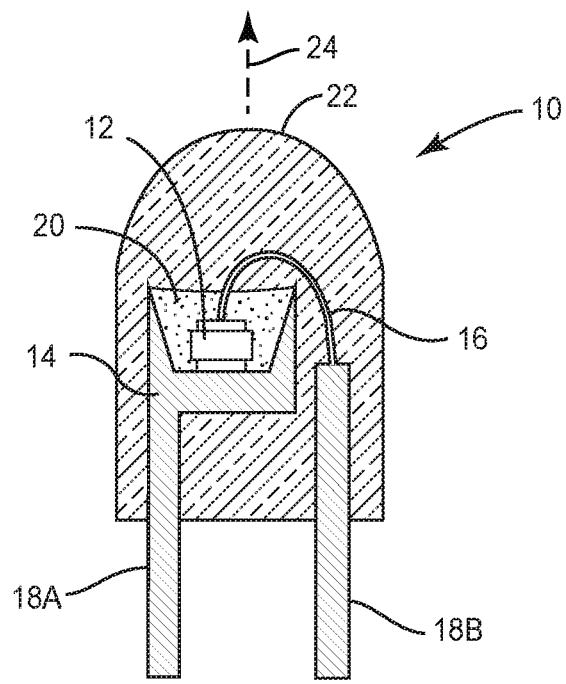
FIG. 1 illustrates a cross-sectional representation of a conventional light-emitting diode (LED).
Figure 2:
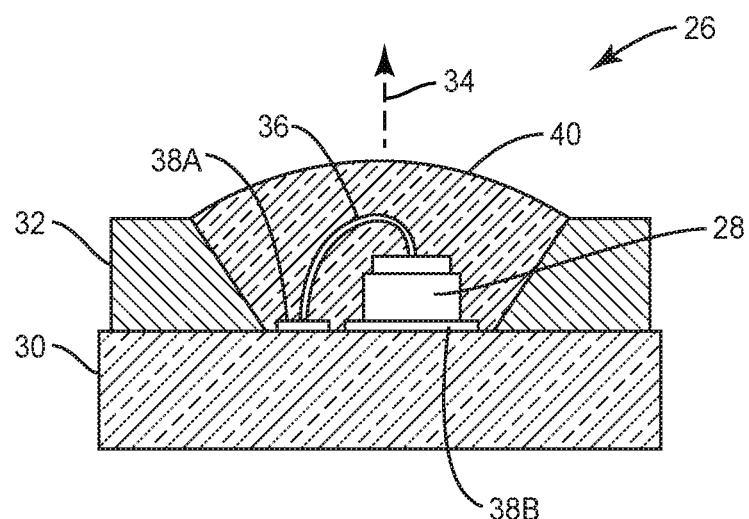
FIG. 2 illustrates a cross-sectional representation of a conventional LED.
Figure 3:
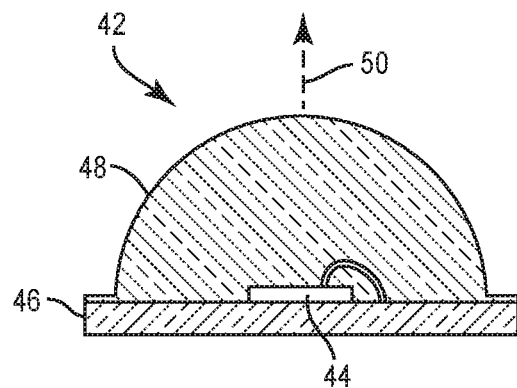
FIG. 3 illustrates a cross-sectional representation of a conventional LED.
Figure 4:
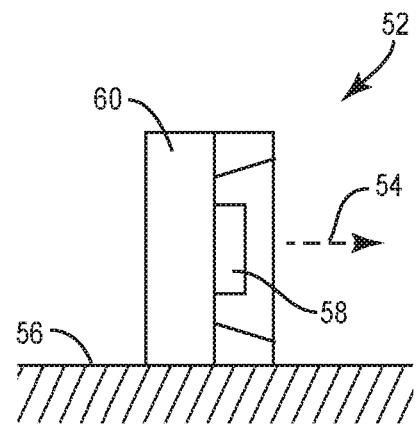
FIG. 4 illustrates a cross-sectional representation of a conventional LED.
Figure 5:
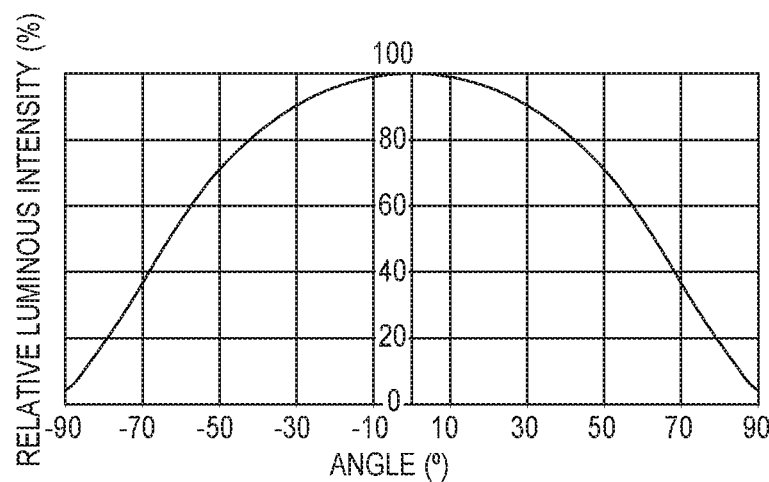
FIG. 5 is a plot representing a typical spatial distribution for a light emission pattern of a conventional LED package.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

The present disclosure relates to solid-state lighting devices including light-emitting diodes (LEDs) and more particularly to LED devices, or LED packages. A light-altering material may be provided in particular configurations within an LED package to redirect light toward a primary emission direction. The light-altering material may be arranged on any of a first face, a second face, or a plurality of sidewalls of an LED chip in the LED package. In certain embodiments, a lumiphoric material may be arranged on one or more sidewalls of the plurality of sidewalls of the LED chip. In certain embodiments, a superstrate is arranged to mechanically support the LED chip from the first face. The light-altering material may be arranged on or dispersed within the superstrate. In certain embodiments, the primary emission direction of the LED package is substantially parallel to the first face or the second face of the LED chip in the LED package. In certain embodiments, an overall thickness or height of the LED package may be less than or equal to 0.25 (millimeters) mm. In other embodiments, an overall thickness or height of the LED package may be thicker than 0.25 mm. The term "superstrate" is used herein, in part, to avoid confusion with other substrates that may be part of the semiconductor light emitting device, such as a growth or carrier substrate of the LED chip or a submount of the LED package. The term "superstrate" is not intended to limit the orientation, location, and/or composition of the structure it describes.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers; nucleation layers; super lattice structures; un-doped layers; cladding layers; contact layers; and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, silicon carbide, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be down-converting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in some embodiments high reflectivity; and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Publication No. 2017/0098746, which is hereby incorporated by reference herein. In some embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and U.S. Publication No. 2015/0179903.

LED packages can be arranged in many different applications to provide illumination of objects, surfaces, or areas. In some applications, it is desirable for an LED package to provide such illumination while having dimensions as small as possible. An example of which is backlighting illumination for liquid crystal displays (LCD) including televisions, laptops, cell phones, and other handheld devices. In certain applications, the backlighting illumination is provided from one or more edges of an LCD display in the form of side-view or side-looker LED packages. As devices with LCD displays continue to become thinner, it is desirable for the corresponding LED packages to also be as thin as possible. While conventional side-view LED packages are continually made thinner than their predecessors, thickness restraints remain and manufacturing difficulties increase due to the configuration of how the LED chips are mounted within the side-view packages. As previously described, light from an active layer would typically have a lambertian emission profile. When the LED chip is mounted in a package, a face of the LED chip that is opposite the mounting surface is a primary emission face of the LED chip. A conventional side-view package typically has an LED chip mounted on a surface of the package such that a primary emission face of the LED chip is oriented predominantly perpendicular to a primary emission direction of the package. The package is then mounted on a side edge of the package in such a manner that the primary emission direction of the package is oriented toward the edge of an LCD display. The dimensions of side-view LED packages are typically measured as an overall length, width, and height of the package. The overall height of the package, which may also be referred to as an overall thickness of the package, is usually the smallest overall dimension. In an LCD application, a side-view package is typically arranged along an edge of the LCD display such that the smallest overall dimension of the package is aligned with the light guide of the display. When a typical side-view LED package is arranged to illuminate a display, the package is mounted on an edge such that a face of the LED chip inside the package directly faces the display. In this regard, conventional side-view LED packages are limited to thicknesses or heights of about 0.5 mm or above, with some examples as low as 0.3 mm. In certain embodiments as disclosed herein, an LED package is provided as a surface mount device having an overall thickness or height of less than or equal to 0.25 mm, or in a range from about 0.06 mm to about 0.25 mm, or in a range from about 0.1 mm to about 0.22 mm, or in a range from about 0.1 mm to about 0.2 mm. In other embodiments, aspects as described herein include an LED package with an overall thickness that is greater than 0.25 mm, or greater than 1 mm.

In certain embodiments as disclosed herein, an LED package includes an LED chip having a first face, a second face, and a plurality of sidewalls therebetween. The LED package further includes a light-altering material that is configured to reflect, refract, or otherwise redirect light, or absorb light from the LED chip. The light-altering material may surround the first face, the second face, and at least one sidewall of the plurality of sidewalls. In further embodiments, the light-altering material may surround the first face, the second face, and at least three sidewalls of the plurality of sidewalls. In certain embodiments, a primary emission direction of the LED package is substantially parallel to the first face or the second face. The LED chip, or multiple LED chips, may be mounted in the LED package on either the first face or the second face. In this manner, an LED package is provided that includes one or more LED chips comprising a first face, a second face, and a plurality of sidewalls therebetween, wherein the one or more LED chips are mounted in the LED package on either the first face or the second face and a primary emission direction of the LED package is substantially parallel to the second face.

Figure 6A:
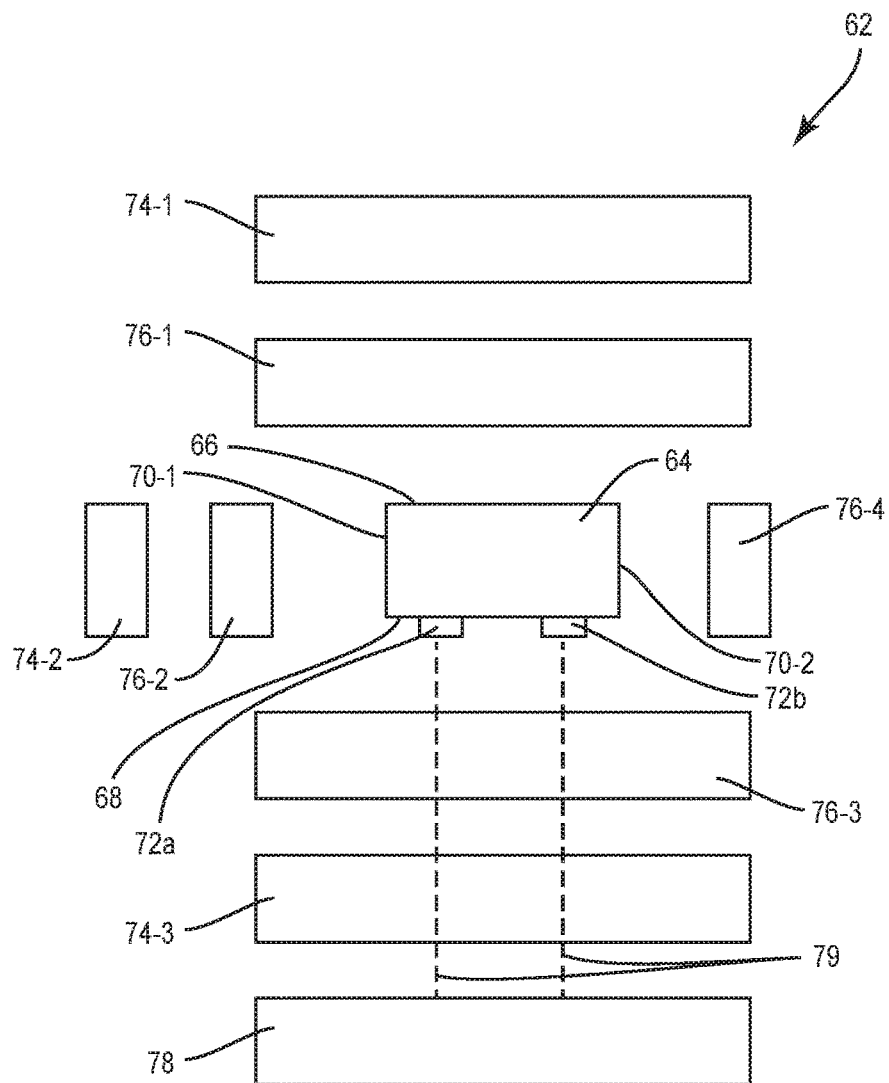
FIG. 6A is an exploded cross-sectional view of an LED package according to embodiments disclosed herein.

FIG. 6A is an exploded cross-sectional view of an LED package 62 according to embodiments disclosed herein. The LED package 62 includes an LED chip 64 that comprises a first face 66, a second face 68, and a plurality of sidewalls

70-1, 70-2 therebetween. While the LED chip 64 is illustrated in a cross-sectional view, it is understood the LED chip 64 includes other sidewalls. For example, a square or rectangular LED chip would include four sidewalls between the first face 66 and the second face 68. In FIG. 6A, the LED chip 64 is illustrated as a lateral flip-chip LED where a chip anode pad 72a and chip cathode pad 72b are both located on the second face 68. In other embodiments, the LED chip 64 may comprise a vertical LED or a lateral LED that is not arranged in a flip-chip manner as previously described. In certain embodiments, the LED package 62 includes light-altering materials 74-1 to 74-3 that are configured to reflect, refract, or otherwise redirect light from the LED chip 64. The light-altering materials 74-1 to 74-3 may be adapted for dispensing, depositing, or placing as a pre-formed component, and may include many different materials including light-reflective or refractive materials that reflect, refract, or otherwise redirect light, light-absorbing materials that absorb light, materials that act as a thixotropic agent, and combinations thereof. In certain embodiments, the light-altering materials 74-1 to 74-3 may include fused silica, fumed silica, and titanium dioxide (TiO$_2$) particles suspended in a binder, such as silicone or epoxy. In other embodiments, the light-altering materials 74-1 to 74-3 include plastic, ceramic, or metal materials. In certain embodiments, the light-altering materials 74-1 to 74-3 may comprise a thickness sufficient to be mechanically stable, or the light-altering materials 74-1 to 74-3 may be deposited or coated on a support component. In some embodiments, the light-altering materials 74-1 to 74-3 may comprise a white color to reflect and redirect light. In other embodiments, the light-altering materials 74-1 to 74-3 may comprise an opaque or black color, such as particles of carbon, silicon, or other materials for absorbing light. The LED package 62 may further include one or more optical materials 76-1 to 76-4 arranged proximate the LED chip 64. The one or more optical materials 76-1 to 76-4 may include lumiphoric materials, encapsulation materials, light diffusing or scattering materials, light filtering materials, and combinations thereof. Additionally, die attach or bonding materials may be provided to mount the LED chip 64 within the LED package 62. In certain embodiments, the LED package 62 may be configured with one or more additional materials 78 that may include further mechanical support, electrical traces, package bond pads, solder mask materials and combinations thereof. For embodiments where the additional materials 78 include electrical traces or other electrical connections, one or more electrically conductive paths 79 may be provided through the light-altering material 74-3 and the optical material 76-3, if present. As previously described, the LED chip 64 may include a square or rectangular LED chip with four sidewalls between the first face 66 and the second face 68. Accordingly, the light-altering material 74-1 to 74-3 may surround the first face 66, the second face 68, and three of the four sidewalls, while not surrounding one of the sidewalls (70-2) that is oriented closest to a primary emission direction of the LED package 62. The one or more optical materials 76-1 to 76-4 may surround anywhere from one to all four sidewalls of the LED chip 64.

Figure 6B:
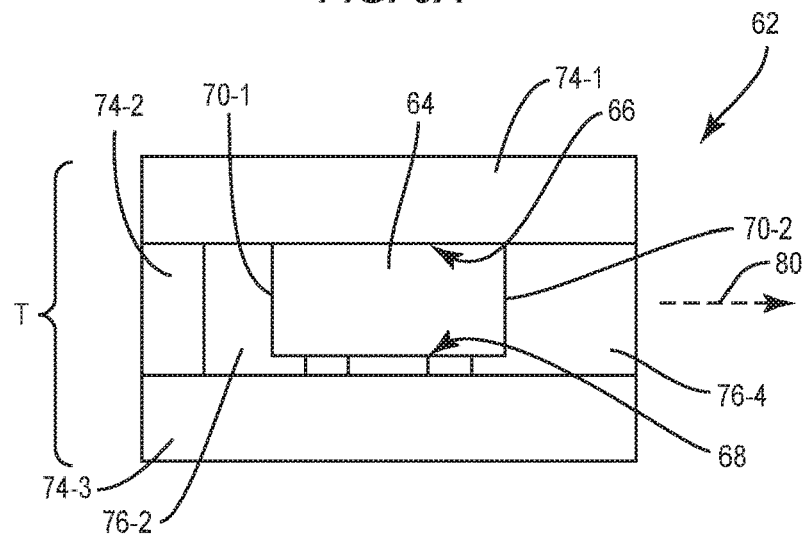
FIG. 6B is an assembled cross-sectional view of an embodiment of the LED package of FIG. 6A.

FIG. 6B is an assembled cross-sectional view of an embodiment of the LED package 62 more generally described in FIG. 6A. In FIG. 6B, the LED chip 64 may be mounted in the LED package 62 on either the first face 66 or the second face 68. In certain embodiments, the light-altering materials 74-1 to 74-3 surround the first face 66, the second face 68, and at least one side wall 70-1 of the LED chip 64. The one or more optical materials 76-2, 76-4 may be provided around the LED chip 64 and between the light-altering materials 74-1 to 74-3. In certain embodiments, the LED chip 64 includes four sidewalls and the light-altering materials 74-1 to 74-3 surround three of the four sidewalls. Notably, the light-altering materials 74-1 to 74-3 do not surround another sidewall 70-2 of the LED chip 64. Accordingly, omnidirectional light that is emitted from the LED chip 64 may be reflected, refracted, or otherwise redirected, or even absorbed by the light-altering materials 74-1 to 74-3 such that a primary emission direction 80 of the LED package 62 is substantially parallel to the first face 66 or the second face 68. By keeping the first face 66 or the second face 68 substantially parallel to the primary emission direction 80, an overall thickness T of the LED package 62 may be reduced compared with conventional side-view packages. For flip-chip configurations of the LED chip 64, epitaxial layers of the LED chip 64 are closer or proximate to the second face 68. In certain embodiments, the one or more optical materials 76-2, 76-4 include a lumiphoric material that is configured to convert at least some of the light of the LED chip 64 to a different wavelength before exiting the LED package 62. As illustrated in FIG. 6B, the one or more optical materials 76-2, 76-4 may only be located adjacent to one or both of the sidewalls 70-1, 70-2 of the LED chip 64. In this manner, the LED chip 64 may be mechanically supported by the light-altering materials 74-1, 74-3 or a component on which the light-altering materials 74-1, 74-3 are formed, and any material that is on or directly on the first face 66 or on or directly on the second face 68 may be devoid of lumiphoric materials. In certain embodiments, the light-altering materials 74-1 to 74-3 are continuous or an integral single component around the first face 66, the second face 68, and the at least one side wall 70-1. In other embodiments, the light-altering materials 74-1 to 74-3 are formed in discontinuous segments and joined together in the LED package 62. For example, the light-altering material 74-1 may be discontinuous with one or each of the light-altering materials 74-2, 74-3.

In certain embodiments, an LED package may include different arrangements of light-altering material. For example, an LED package may include an LED chip comprising a first face, a second face, and a plurality of sidewalls therebetween, a first light-altering material substantially covering the first face, and a lumiphoric material arranged on a first sidewall of the plurality of sidewalls. A primary emission direction of the LED package is substantially parallel to the first face or the second face as previously described. The first light-altering material may be arranged in one or more layers on the superstrate or dispersed within a superstrate that mechanically supports the LED chip. The superstrate may comprise a light-altering material as a dispersion of particles. A second light-altering material may be arranged on the second face of the LED chip and a third light-altering material may extend between the first light-altering material and the second light-altering material. Each of the first, second, and third light-altering materials may include the same materials. In other embodiments, at least one of the first, second, and third light-altering materials may include a different type or amount of material than the other light-altering materials. In this regard, different areas of the LED package may be tailored to reflect, refract, or otherwise redirect light, or absorb light in differing amounts based on a particular application. In certain embodiments, at least one of the first, second, or third light-altering materials, or another optical material may comprise a thinned material through with a portion of the LED chip may be exposed or otherwise electrically connected.

Figure 7A:
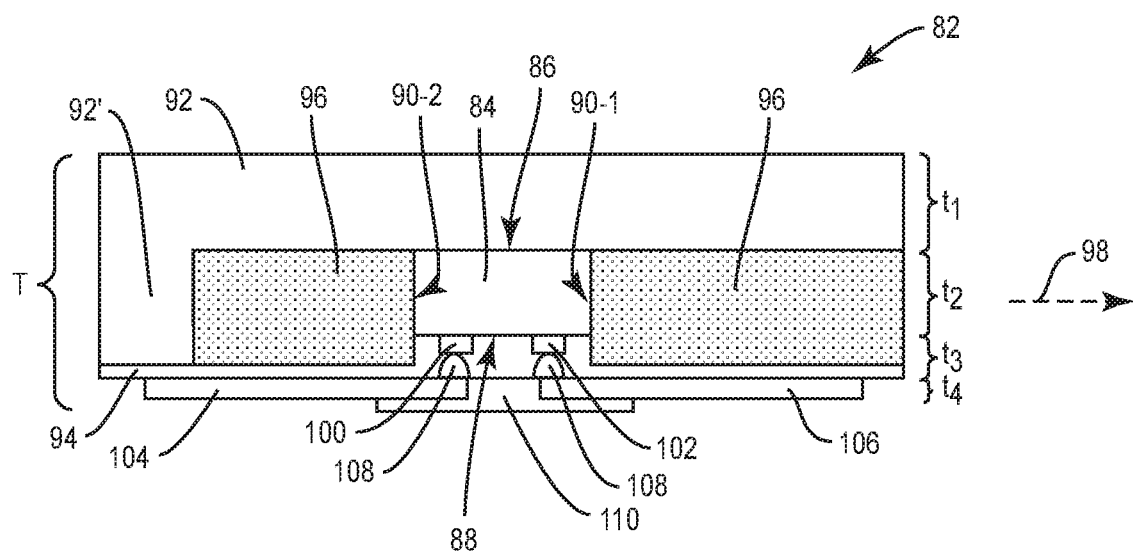
FIG. 7A is a cross-sectional view of an LED package according to embodiments disclosed herein.

FIG. 7A is a cross-sectional view of an LED package 82 according to embodiments disclosed herein. The LED package 82 includes an LED chip 84 that includes a first face 86, a second face 88, and a plurality of sidewalls 90-1, 90-2 therebetween; a first light-altering material 92; a second light-altering material 94; and an optical material 96 as previously described. In certain embodiments, the optical material 96 includes a lumiphoric material that is arranged on at least one of a first sidewall 90-1 and a second sidewall 90-2 of the LED chip 84. As illustrated, the first light-altering material 92 substantially covers the first face 86. In certain embodiments, at least a portion 92' of the first light-altering material 92 may additionally extend along and be optionally spaced apart from at least the second sidewall 90-2. The first light-altering material 92 may also be dispersed in a superstrate that is configured to mechanically support the LED chip 84 from the first face 86. Accordingly, the superstrate may comprise a material and/or a thickness that is sufficient to be mechanically stable as previously described. In other embodiments, the first light-altering material 92 may be deposited, coated, or otherwise arranged on a separate superstrate. In certain embodiments, the superstrate may comprise at least one of silicone, epoxy, plastic, ceramic, metal, sapphire, Si, or SiC, among others. As illustrated in FIG. 7A, the second light-altering material 94 may be arranged on the second face 88 of the LED chip 84 and the portion 92' of the first light-altering material 92 that extends toward the second light-altering material 94 along at least the second sidewall 90-2. In certain embodiments, the first light-altering material 92 surrounds three sidewalls of the plurality of sidewalls 90-1, 90-2 as previously described. The second light-altering material 94 may additionally extend on the optical material 96. In this regard, the LED chip 84 may be surrounded by the first and second light-altering materials 92, 94 everywhere except for the first sidewall 90-1. Accordingly, light from the LED chip 84 as well as light converted by any lumiphoric material present in the optical material 96 may have a primary emission direction 98 from the LED package 82 that is substantially parallel to the first face 86 or the second face 88. As illustrated in FIG. 7A, the LED chip 84 further includes a chip anode pad 100 and a chip cathode pad 102. For flip-chip embodiments, the chip anode pad 100 and the chip cathode pad 102 may be formed on the second face 88 of the LED chip 84. The LED package 82 may further include a package anode pad 104 and a package cathode pad 106 arranged to electrically connect with the LED chip 84 from the second face 88. In particular, the package anode pad 104 and the package cathode pad 106 are electrically connected with the corresponding chip anode pad 100 and the chip cathode pad 102. One or more electrically conductive paths 108 may be formed through the second light-altering material 94 to make these electrical connections. The electrically conductive paths 108 may include, but are not limited to, electrically conductive pedestals, bump bonds, solder material, wires, and vias. In certain embodiments, the second light-altering material 94 comprises a thinned light-altering material through which the electrically conductive paths 108 from the LED chip 84 are exposed. Additionally, the LED package 82 may include an insulating material 110 positioned between the package anode pad 104 and the package cathode pad 106 to provide electrical insulation when mounting the LED package 82. The insulating material 110 may include a solder mask material as well as other dielectric materials.

As previously described, by positioning the first face 86 or the second face 88 substantially parallel to the primary emission direction 98 of the LED package 82, the overall thickness T of the LED package 82 may be reduced compared with conventional side-view packages that turn the entire package including the LED chip inside on an edge. For the LED package 82, a thickness $t_1$ of the first light-altering material 92 as measured from the first face 86 may include a range of about 30 microns (µm) to about 300 µm or more, or a range of about 50 µm to about 150 µm. In certain embodiments, the first light-altering material 92 may initially comprise a larger thickness (e.g. about 150 µm) and then the first light-altering material 92 may subsequently be thinned to a smaller thickness (e.g. about 50 µm). The LED chip 84 may comprise a thickness $t_2$ in a range of about 3 µm to about 200 µm, or in a range of about 3 µm to about 100 µm. For a thickness $t_2$ of about 3 µm, a growth substrate of the LED chip 84 may be removed. The second light-altering material 94 may comprise a total thickness $t_3$ as measured from the second face 88 in a range of about 3 µm to about 150 µm, or in a range of about 10 µm to about 100 µm, or in a range of about 20 µm to about 60 µm. The package anode pad 104 and the package cathode pad 106 may comprise a thickness $t_4$ in a range of about 1 µm to about 100 µm, or in a range of about 10 µm to about 70 µm, or in a range of about 20 µm to about 50 µm. In certain embodiments, an LED package may be configured with the thickness $t_1$ of about 50 µm, the thickness $t_2$ of about 100 µm, the thickness $t_3$ of about 40 µm, and the thickness $t_4$ of about 30 µm to provide an overall thickness of about 220 µm, or 0.22 mm. Accordingly, in certain embodiments as disclosed herein, the LED package 82 is provided as a surface mount LED package or device with an overall thickness of less than or equal to 0.25 mm, or in a range from about 0.06 mm to about 0.25 mm, or in a range from about 0.1 mm to about 0.22 mm, or in a range from about 0.1 mm to about 0.2 mm. In other embodiments, the LED package 82 may have an overall thickness of greater than 0.25 mm.

Figure 7B:
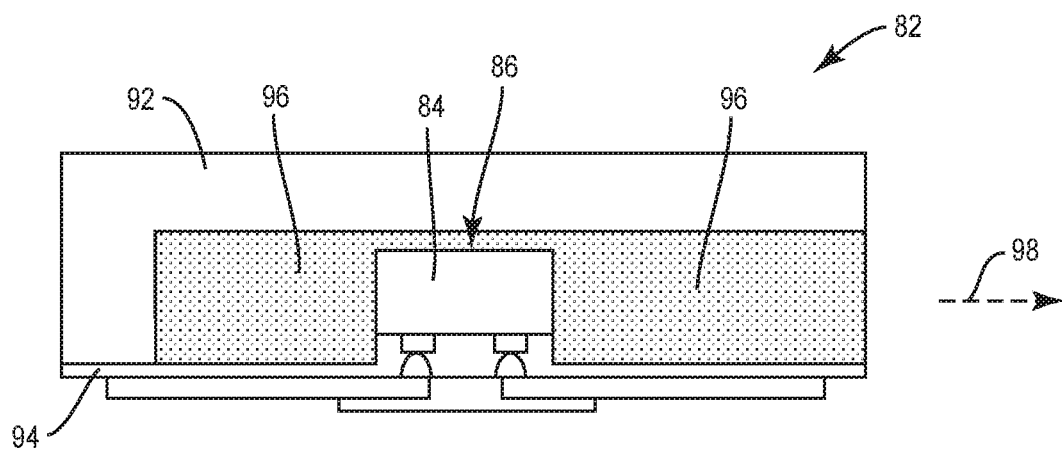
FIG. 7B is a cross-sectional view of the LED package of FIG. 7A with an alternative configuration of the optical material according to embodiments disclosed herein.

FIG. 7B is a cross-sectional view of the LED package 82 of FIG. 7A with an alternative configuration of the optical material 96 according to embodiments disclosed herein. In FIG. 7B, the optical material 96 is positioned between the first light-altering material 92 and the second light-altering material 94 in a similar manner as illustrated in FIG. 7A. In FIG. 7B, however, at least a portion of the optical material 96 is also positioned between the first light-altering material 92 and the first face 86 of the LED chip 84. In this manner, light emitting from the LED chip 84 that passes through the first face 86 may interact with the optical material 96 before being reflected, refracted, or otherwise re-directed, or even absorbed by the first light-altering material 92. In certain embodiments, the optical material 96 includes a lumiphoric material and accordingly, at least a portion of light from the LED chip 84 that passes through the first face 86 may be converted to a different wavelength before exiting the package in the primary emission direction 98.

LED packages according to embodiments disclosed herein may be manufactured in a variety of processing steps. In particular, a plurality of LED packages may be formed in bulk on a common superstrate before they are singulated into individual LED packages. For example, a plurality of LED chips may be mounted on a common superstrate that includes a first light-altering material. An optical material that may include one or more lumiphoric materials, a second light-altering material, and electrical contacts for the plurality of LED packages may be subsequently formed on the common superstrate before individual LED packages are singulated. In this manner, different processing steps may be applied to a plurality of LED packages at the same time, thereby saving costs and reducing variation between individual LED packages.

Figure 8A:
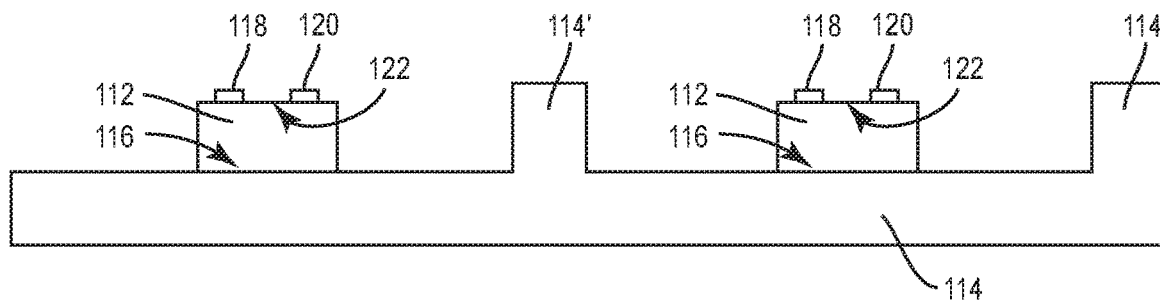
FIGS. 8A-8I illustrate cross-sectional views at various steps of an exemplary manufacturing process according to embodiments disclosed herein.

FIGS. 8A-8I illustrate cross-sectional views at various steps of an exemplary manufacturing process according to embodiments disclosed herein. In FIG. 8A, a plurality of LED chips 112 are mounted on a superstrate 114. In certain embodiments, the plurality of LED chips 112 may be mounted using a die attach adhesive, typically containing an epoxy or silicone. In this manner, each of the plurality of LED chips 112 is mechanically supported by the superstrate 114 at a first face 116 of each of the plurality of LED chips 112. Additionally, each of the plurality of LED chips 112 includes a chip anode pad 118 and a chip cathode pad 120 on a second face 122 that is opposite the first face 116. The superstrate 114 may include a plurality of superstrate portions 114' that extend upward between the plurality of LED chips 112 and will serve as dividers for individual LED packages at later processing steps. As previously described, the superstrate 114 may comprise at least one of silicone, epoxy, plastic, ceramic, metal, sapphire, Si, or SiC, among others and a first light-altering material may be deposited or coated on, or dispersed within the superstrate 114. The first light-altering material may include fused silica, fumed silica, or $TiO_2$, other white particles, or even black particles suspended in a binder, such as silicone or epoxy.

Figure 8B:
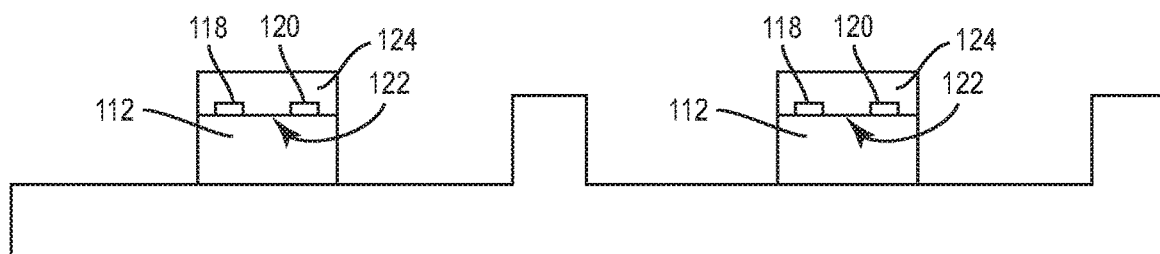

In FIG. 8B, a dry film 124, such as a photoresist, is applied to the second face 122 of each LED chip 112. The dry film 124 is provided to substantially cover and protect each of the chip anode pads 118 and the chip cathode pads 120 during subsequent processing steps.

Figure 8C:
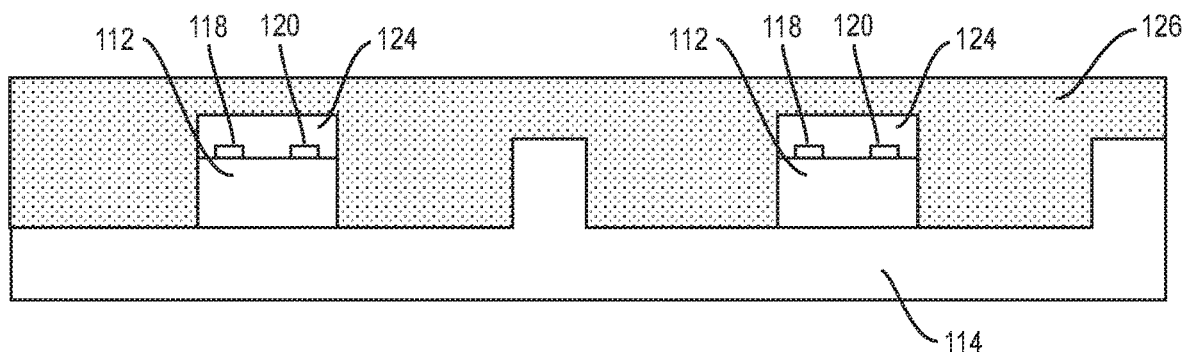

In FIG. 8C, an optical material 126 is dispensed or otherwise applied to the superstrate 114. As previously described, the optical material 126 may include lumiphoric materials, encapsulation materials, light diffusing or scattering materials, light filtering materials, and combinations thereof. In certain embodiments, the optical material 126 includes one or more lumiphoric materials dispersed in a binder. As illustrated, the optical material 126 substantially covers each of the LED chips 112 and the superstrate 114. The dry film 124 on each of the LED chips 112 serves to prevent the optical material 126 from contacting each of the chip anode pads 118 and the chip cathode pads 120.

Figure 8D:
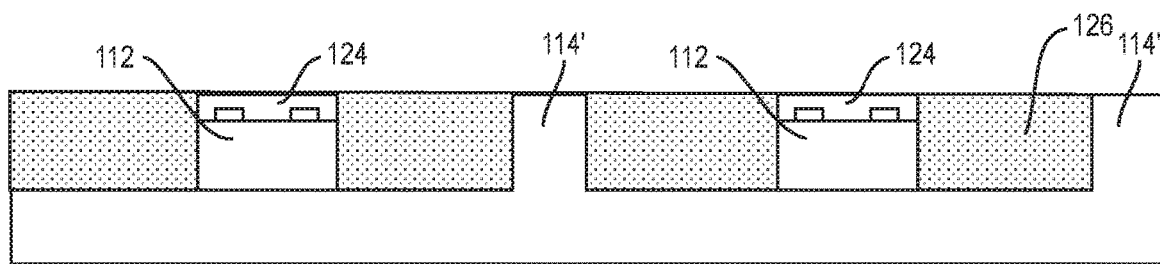

In FIG. 8D, a portion of the optical material 126 is removed to expose the dry film 124 on each of the LED chips 112. Removing a portion of the optical material 126 may comprise one or more steps of planarization, grinding, polishing, or other material removal steps. In certain embodiments, the superstrate portions 114' may also be exposed after removing a portion of the optical material 126.

Figure 8E:
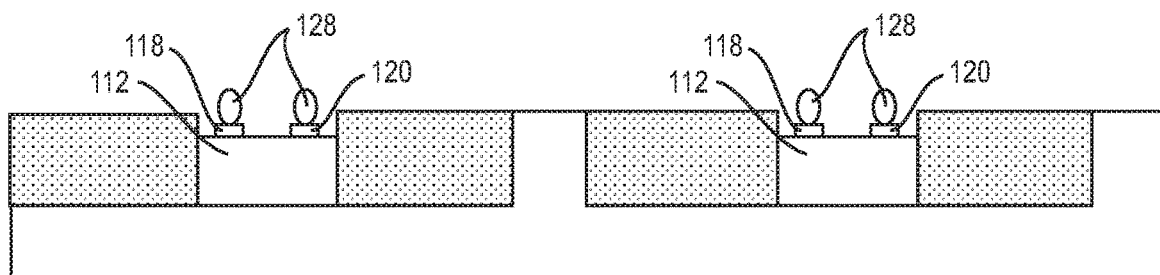

In FIG. 8E, the dry film 124 of FIG. 8D is removed to expose the chip anode pads 118 and the chip cathode pads 120 of each of the LED chips 112. Subsequently, a plurality of electrically conductive paths 128 are formed on the chip anode pads 118 and the chip cathode pads 120. As previously described, the electrically conductive paths 128 may include, but are not limited to, at least one of electrically conductive pedestals, bump bonds, solder material, wires, and vias.

Figure 8F:
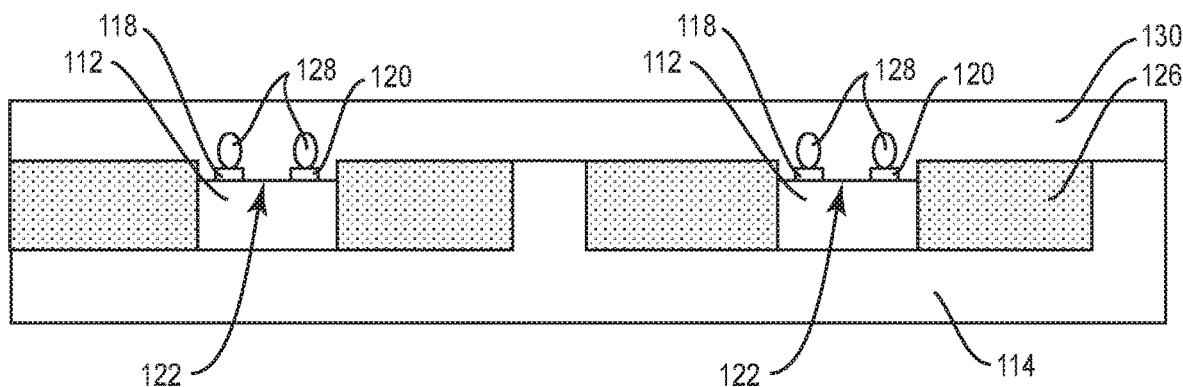

In FIG. 8F, a second light-altering material 130 is deposited or dispensed over the superstrate 114. As illustrated, the second light-altering material 130 substantially covers the optical material 126 as well as each of the LED chips 112. Additionally, the second light-altering material 130 substantially covers the chip anode pads 118, the chip cathode pads 120, and the electrically conductive paths 128. In this manner, at least a portion of the second light-altering material 130 is provided on the second face 122 of each LED chip 112 between and around where the chip anode pads 118 and the chip cathode pads 120 are located. Accordingly, light from a particular LED chip 112 may be reflected, refracted, or otherwise redirected, or even absorbed by the second light-altering material 130 at the second face 122. The second light-altering material 130 may include fused silica, fumed silica, or $TiO_2$, other white particles, or even black particles suspended in a binder, such as silicone or epoxy as previously described.

Figure 8G:
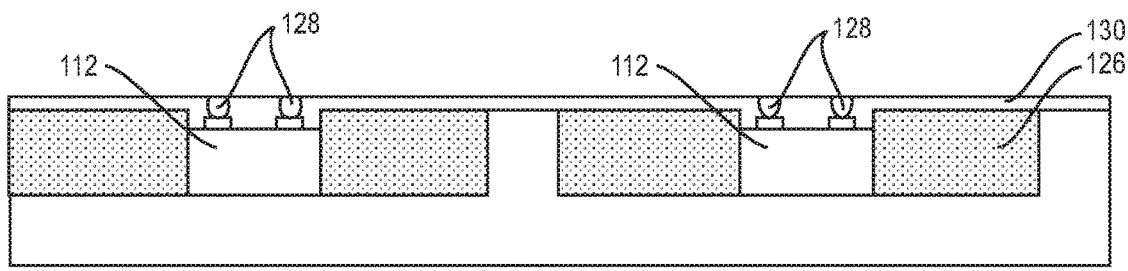

In FIG. 8G, a portion of the second light-altering material 130 is removed to expose the electrically conductive paths 128 on each of the LED chips 112. Removing a portion of the second light-altering material 130 may comprise one or more steps of planarization, grinding, polishing, thinning or other material removal steps. Notably, the second light-altering material 130 is thinned but not completely removed on the optical material 126, thereby exposing a portion of each of the LED chips 112, in this case the electrically conductive paths 128. In this regard, the second light-altering material 130 covers the LED chips 112 and the optical material 126 while leaving a portion of each of the electrically conductive paths 128 exposed to facilitate electrical connection to the LED chips 112.

Figure 8H:
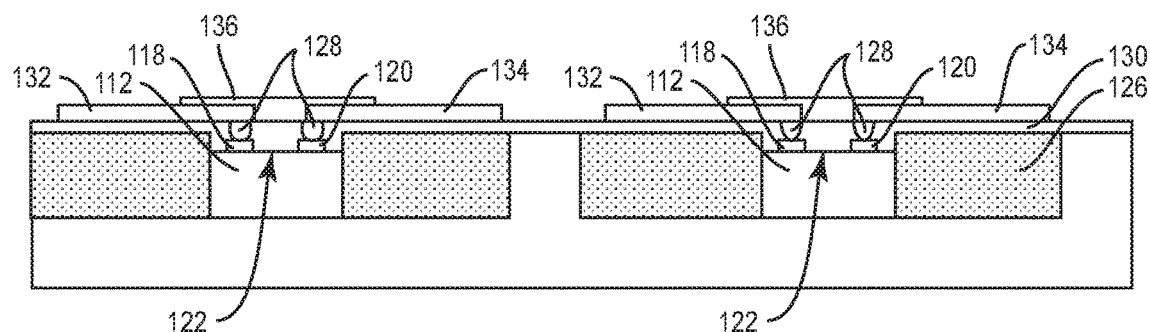

In FIG. 8H, a package anode pad 132 and a package cathode pad 134 are formed over each of the LED chips 112 and the second light-altering material 130. The package anode pad 132 and the package cathode pad 134 are arranged to electrically connect with the second face 122 of each of the LED chips 112. In particular, each package anode pad 132 is electrically connected to each chip anode pad 118 and each package cathode pad 134 is electrically connected to each chip cathode pad 120 by way of the electrically conductive paths 128. In certain embodiments, an insulating material 136 may be positioned between the package anode pad 132 and the package cathode pad 134 to provide electrical insulation. The insulating material 136 may include a solder mask material as well as other dielectric materials as previously described.

Figure 8I:
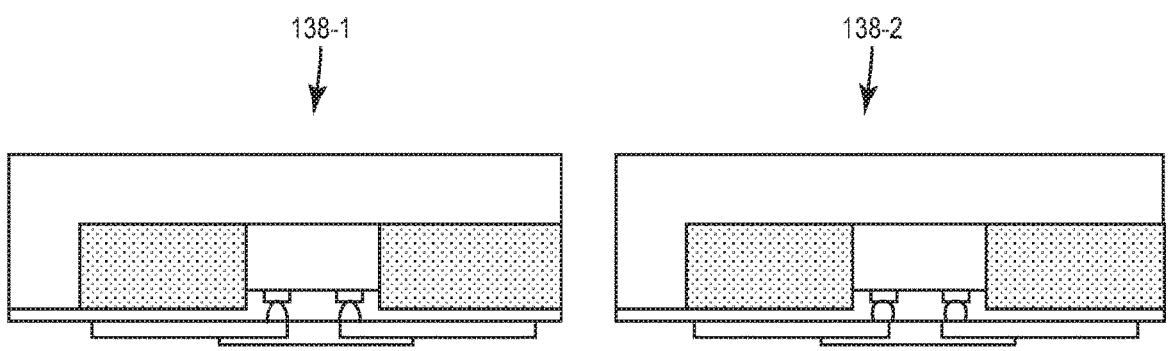

In FIG. 8I, individual LED packages 138-1, 138-2 have been singulated and are ready to be surface mounted to a receiving substrate such as a printed circuit board (PCB). The singulation step may include sawing or dicing with a mechanical saw or a laser. In further embodiments, the singulation step may include forming dicing lines with a saw or laser, followed by applying a mechanical pressure to complete singulation.

Figure 9A:
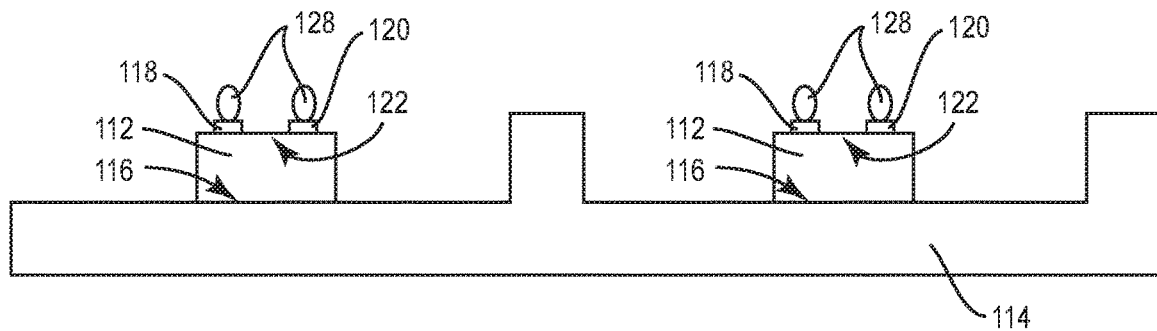
FIGS. 9A-9F illustrate cross-sectional views at various steps of an alternative manufacturing process to the one illustrated in FIGS. 8A-8I where the second light-altering material is omitted according to embodiments disclosed herein.
Figure 9B:
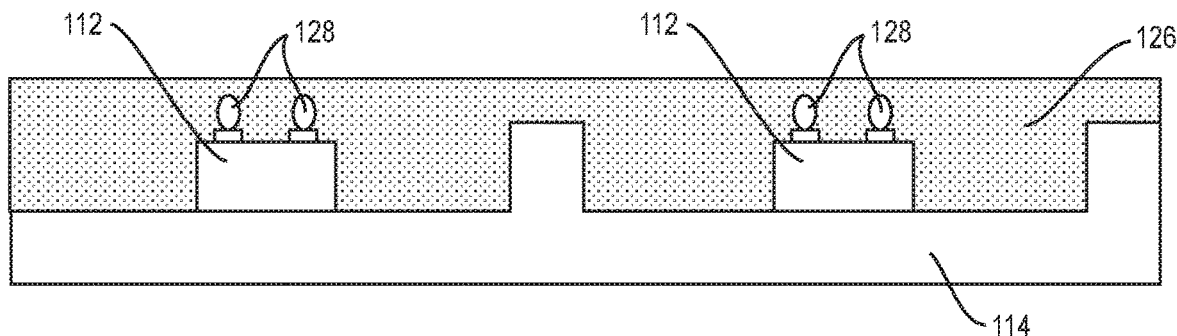
Figure 9C:
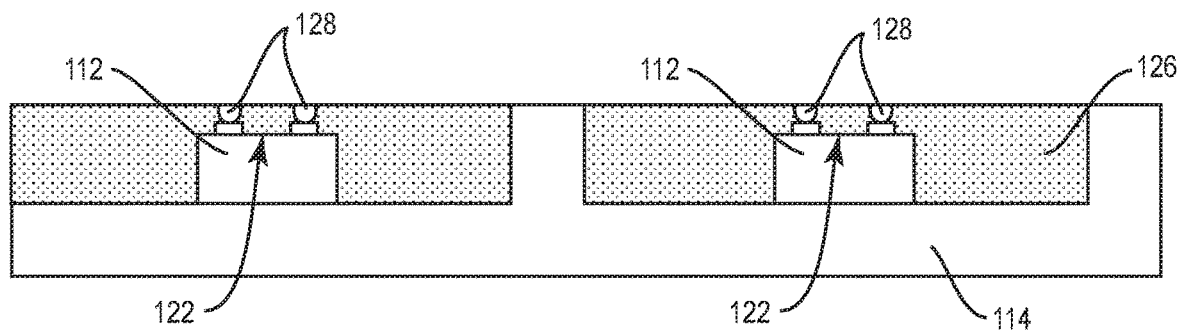
Figure 9D:
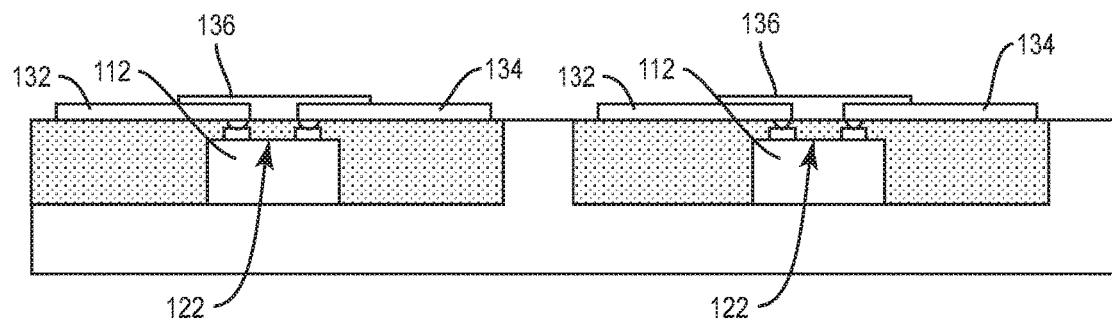
Figure 9E:
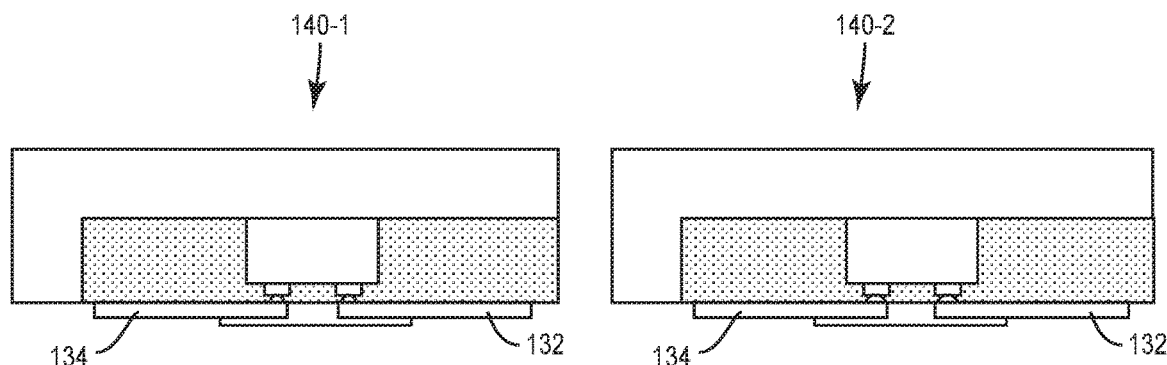
Figure 9F:
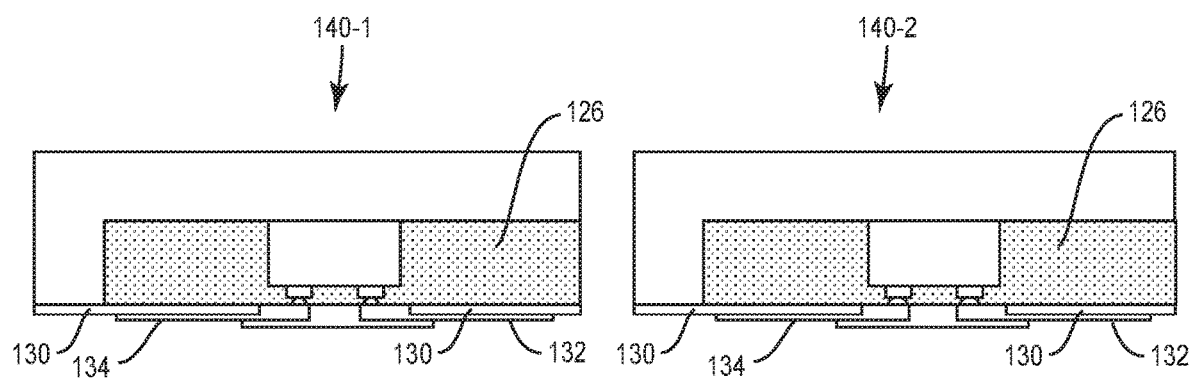

FIGS. 9A-9F illustrate cross-sectional views at various steps of an alternative manufacturing process to the one illustrated in FIGS. 8A-8I where the second light-altering material 130 is omitted according to embodiments disclosed herein. For simplicity, common or similar elements are numbered the same as those in FIGS. 8A-8I. In FIG. 9A, the plurality of LED chips 112 are mounted on the superstrate 114 at the first face 116 of each LED chip 112. In certain embodiments, the plurality of LED chips 112 may be mounted using a die attach adhesive, typically containing an epoxy or silicone. Each of the plurality of LED chips 112 further includes the chip anode pad 118 and the chip cathode pad 120 on the second face 122 of each LED chip 112. In FIG. 9A, the plurality of electrically conductive paths 128 are formed on the chip anode pads 118 and the chip cathode pads 120 before subsequent processing steps. In FIG. 9B, the optical material 126 is dispensed or otherwise applied to the superstrate 114, and the optical material 126 substantially covers the LED chips 112 as well as the electrically conductive paths 128. In FIG. 9C, a portion of the optical material 126 is removed or planarized to expose the electrically conductive paths 128 on each of the LED chips 112. As illustrated, a portion of the optical material 126 is positioned on the second face 122 of each LED chip 112 between and around where the chip anode pads 118 and the chip cathode pads 120 are located. In FIG. 9D, the package anode pads 132 and the package cathode pads 134 are formed over each of the LED chips 112. The package anode pad 132 and the package cathode pad 134 are arranged to electrically connect with the second face 122 of each of the LED chips 112. Additionally, the insulating material 136 may be positioned between the package anode pad 132 and the package cathode pad 134 as previously described. In FIG. 9E, individual LED packages 140-1, 140-2 have been singulated and are ready to be surface mounted to receiving substrate such as a PCB. Notably, the individual LED packages 140-1, 140-2 do not have the second light-altering material 130 of FIG. 8H. In this regard, the package anode pads 132 and the package cathode pads 134 may comprise at least one layer or material that reflects, refracts, redirects, and/or absorbs light. FIG. 9F illustrates an alternative configuration for the LED packages 140-1, 140-2 of FIG. 9E. In particular, the second light-altering material 130 of previous embodiments is positioned between the package anode pads 132 and the package cathode pads 134 and the optical material 126 to improve light reflection at the interface between the optical material 126 and the second light-altering material 130, thereby improving brightness of the package. The second light-altering material 130 may be formed by stencil printing, screen printing, a photo process, or the like.

Figure 10:
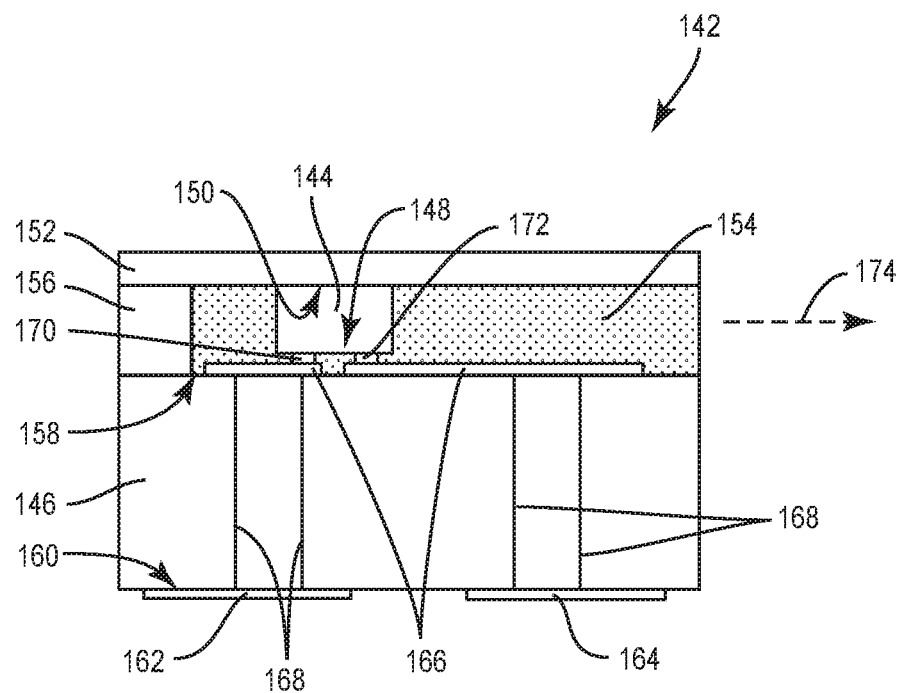
FIG. 10 is a cross-sectional view of an LED package according to embodiments disclosed herein where an LED chip is mounted to a submount from a second face of the LED chip.

FIG. 10 is a cross-sectional view of an LED package 142 according to embodiments disclosed herein where an LED chip 144 is mounted to a submount 146 from a second face 148 of the LED chip 144. In this manner, the LED chip 144 is mechanically supported by the submount 146 from the second face 148. The LED chip 144 further includes a first face 150 that is opposite the second face 148. A first light-altering material 152 is provided on the first face 150 and may be formed with or without a superstrate as previously described. In this manner, the first light-altering material 152 may include fused silica, fumed silica, $TiO_2$, other white particles, or black particles suspended in a binder, such as silicone or epoxy. An optical material 154 as previously described may be formed around the LED chip 144 on the submount 146, and the first light-altering material 152 may be dispensed or otherwise deposited over the LED chip 144 and the optical material 154. A second light-altering material 156 may surround one or more sidewalls of the LED chip 144 between the first light-altering material 152 and the submount 146. In certain embodiments, the first light-altering material 152 comprises the same material or group of materials as the second light-altering material 156. In further embodiments, the first light altering material 152 and the second light-altering material 156 may be continuous or an integral single component with each other. In other embodiments, the first light-altering material 152 comprises a different material or group of materials than the second light-altering material 156. Suitable materials for the submount 146 include, but are not limited to ceramic materials such as aluminum oxide or alumina, AlN, or organic insulators like polyimide (PI) and polyphthalamide (PPA). In other embodiments the submount 146 can comprise a PCB, sapphire, Si or any other suitable material. For PCB embodiments different PCB types can be used such as standard FR-4 PCB, metal core PCB, or any other type of PCB. The submount 146 includes a first submount surface 158 and a second submount surface 160 that is opposite the first submount surface 158. A package anode pad 162 and a package cathode pad 164 are provided on the second submount surface 160 and are connected to corresponding electrical traces 166 on the first submount surface 158 by a plurality of vias 168 that extend through the submount 146. The LED chip 144 is mounted to the electrical traces 166 in a manner such that a chip anode pad 170 is electrically connected to the package anode pad 162 and a chip cathode pad 172 is electrically connected to the package cathode pad 164. As with other embodiments, a primary emission direction 174 of the LED package 142 is substantially parallel to the first face 150 or the second face 148 of the LED chip 144.

Figure 11:
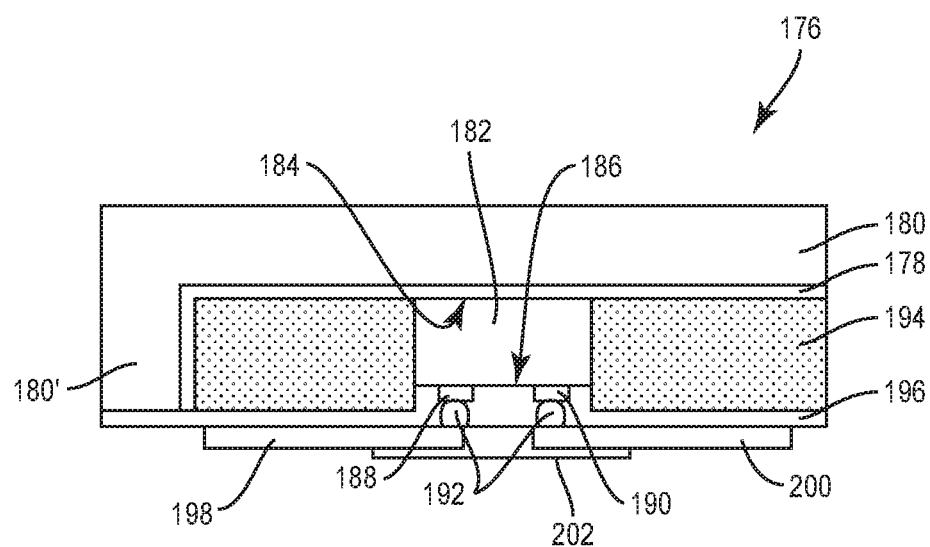
FIG. 11 is a cross-sectional view of an LED package according to embodiments disclosed herein where a first light-altering material is formed on a superstrate.

FIG. 11 is a cross-sectional view of an LED package 176 according to embodiments disclosed herein where a first light-altering material 178 is formed on a superstrate 180. An LED chip 182 is mechanically supported by the superstrate from a first face 184 of the LED chip 182. A second face 186 of the LED chip 182, which is opposite the first face 184, comprises a chip anode pad 188, a chip cathode pad 190, and corresponding electrically conductive paths 192 as previously described. An optical material 194 surrounds the LED chip 182 and a second light-altering material 196 substantially covers the LED chip 182 and the optical material 194 in a manner similar to previous embodiments. A package anode pad 198, a package cathode pad 200, and an insulating material 202 as previously described complete the package. Notably, the first light-altering material 178 is positioned between the superstrate 180 and the LED chip 182. Additionally, the first light-altering material 178 may be conformal to the superstrate 180 and a portion 180' of the superstrate 180 that extends toward the second light-altering material 196. In certain embodiments, the first light altering material 178 is arranged in one or more layers on the superstrate 180. The one or more layers may comprise one or more materials including metal, oxide, ceramic, polymers, or combinations thereof.

Figure 12:
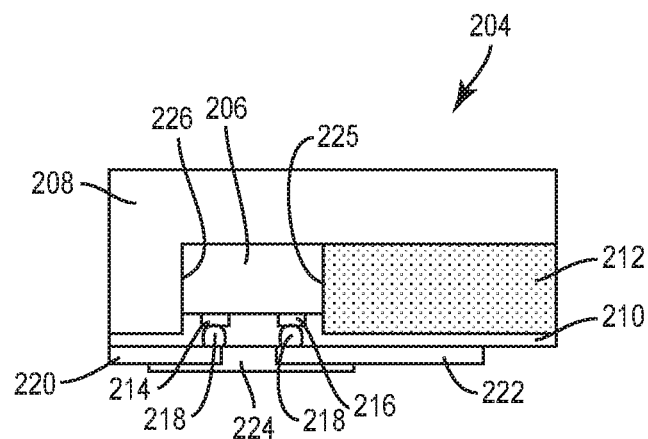
FIG. 12 is a cross-sectional view of an LED package according to certain embodiments disclosed herein.

FIG. 12 is a cross-sectional view of an LED package 204 according to certain embodiments disclosed herein. The LED package 204 may include an LED chip 206, a first light-altering material 208, a second light-altering material 210, an optical material 212, a chip anode pad 214, a chip cathode pad 216, electrically conductive paths 218, a package anode pad 220, a package cathode pad 222, and an insulating material 224 as previously described. The optical material 212 may include a lumiphoric material that is arranged on a first sidewall 225 of the LED chip 206. Notably, a second sidewall 226 of the LED chip 206 is positioned such that none of the optical material 212 is between the second sidewall 226 and the first light-altering material 208. In this regard, light from the LED chip 206 may be redirected by a portion of the first light-altering material 208 and a portion of the second light-altering material 210 before interacting with the optical material 212. In some embodiments, three sidewalls of the LED chip 206 are configured so none of the optical material 212 is between the three sidewalls and the first light-altering material 208.

Figure 13:
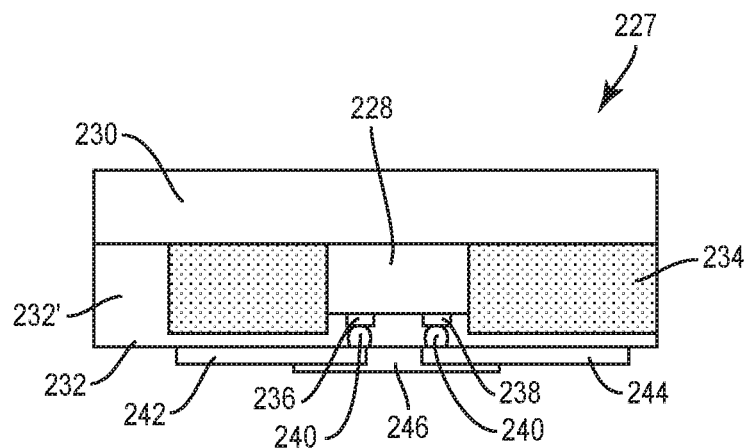
FIG. 13 is a cross-sectional view of an LED package according to certain embodiments disclosed herein.

FIG. 13 is a cross-sectional view of an LED package 227 according to certain embodiments disclosed herein. The LED package 227 may include an LED chip 228, a first light-altering material 230, a second light-altering material 232, an optical material 234, a chip anode pad 236, a chip cathode pad 238, electrically conductive paths 240, a package anode pad 242, a package cathode pad 244, and an insulating material 246 as previously described. Notably, the first light-altering material 230 does not include a portion that extends toward the second light-altering material 232.

In certain embodiments, the first light-altering material 230 is planar. The LED chip 228 may be attached to the first light-altering material 230 and the optical material 234 is formed around the LED chip 228. The second light-altering material 232 substantially covers the LED chip 228 and the optical material 234. Additionally, a portion 232' of the second light-altering material 232 extends toward the first light-altering material 230. In this manner, the second light-altering material 232 may surround one or more sidewalls of the LED chip 228 as well as the optical material 234.

Figure 14:
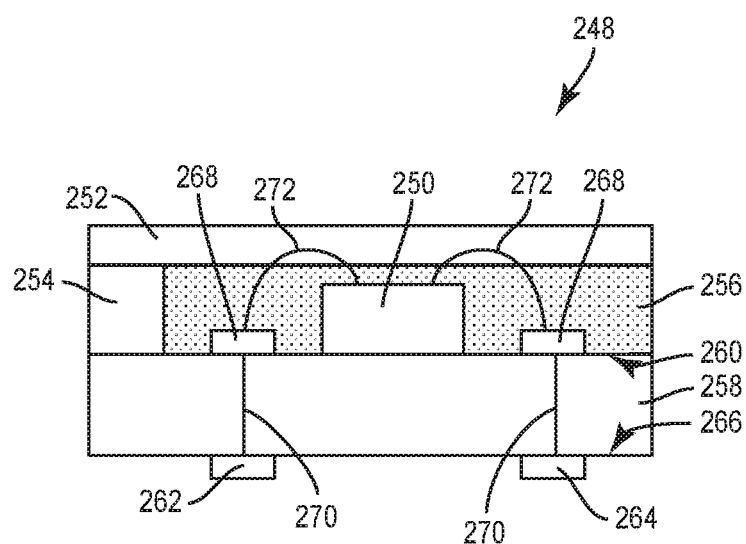
FIG. 14 is a cross-sectional view of an LED package according to certain embodiments disclosed herein.

FIG. 14 is a cross-sectional view of an LED package 248 according to certain embodiments disclosed herein. The LED package 248 may include an LED chip 250, a first light-altering material 252, a second light-altering material 254, an optical material 256, and a submount 258 as previously described. In a similar manner to the submount 146 of FIG. 10, the LED chip 250 is mounted on a first submount surface 260, and a package anode pad 262 and a package cathode pad 264 are provided on a second submount surface 266. The package anode pad 262 and the package cathode pad 264 are electrically connected to corresponding electrical traces 268 on the first submount surface 260 by a plurality of vias 270. In contrast to the LED chip 144 of FIG. 10, the LED chip 250 is electrically connected to the electrical traces 268 by one or more wirebonds 272. Notably, in certain embodiments, the one or more wirebonds 272 extend or loop into and are at least partially embedded in the first light-altering material 252 before connecting with the electrical traces 268. In this manner, a portion of the one or more wirebonds 272 are concealed from paths of light from the LED chip 250 and accordingly, less light may be absorbed by the one or more wirebonds 272. In other embodiments, the one or more wirebonds 272 may only extend or loop through the optical material 256.

In certain embodiments as disclosed herein, LED packages may include a vertical LED chip with anode and cathode connections on opposing sides of the LED chip. In this regard, one of the anode or cathode connections of the LED chip may be electrically and mechanically mounted to an electrical trace on a submount and the other of the anode or cathode connections of the LED chip may be wire-bonded to a different electrical trace on the submount. In certain embodiments, various elements of the LED package, including but not limited to the superstrate, may include reinforcement materials such as one or more ceramics or fiberglass. In certain embodiments as disclosed herein, LED packages may include other electrical components such as one or more electrostatic discharge (ESD) chips, and active or passive electrical components, and combinations thereof.

Figure 15A:
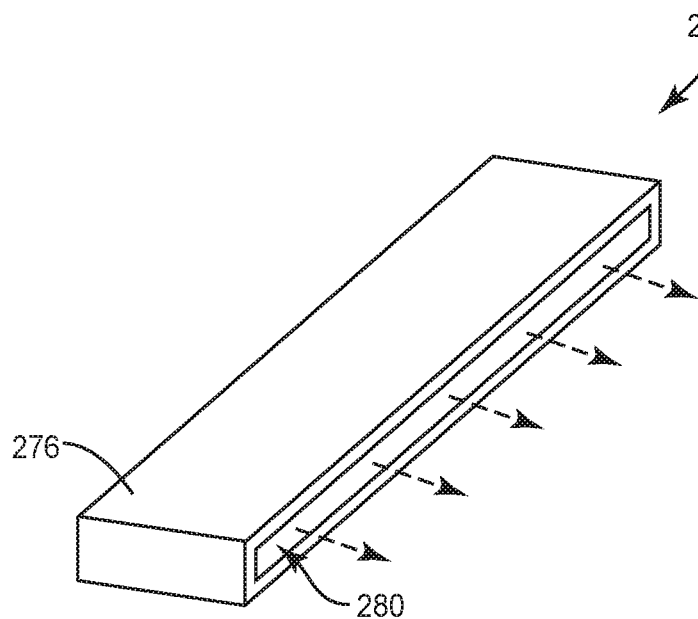
FIG. 15A is a perspective view of an LED package according to embodiments disclosed herein with dashed arrows indicating a primary emission direction of light.
Figure 15B:
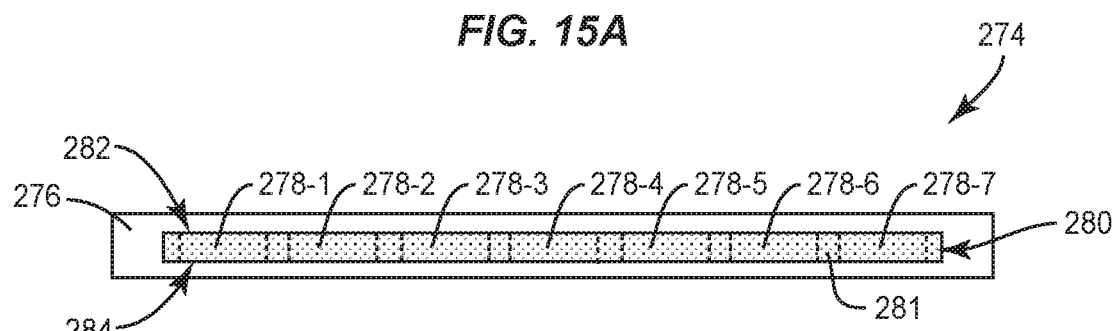
FIG. 15B is a side view of the LED package of FIG. 15A taken from the primary emission direction.
Figure 16:
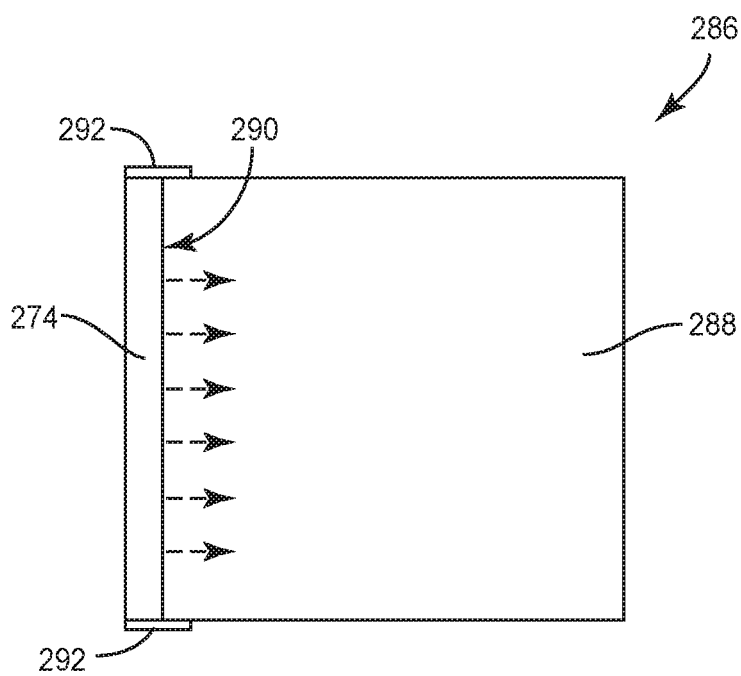
FIG. 16 illustrates a top view of a lighting device that includes the LED package of FIGS. 15a and 15b.

LED packages as disclosed herein may be particularly suited for edge-lit lighting applications, where LED light sources are positioned along an edge of a light guide to provide backlighting for LCD displays or general illumination in other lighting applications. FIGS. 15A and 15B illustrate various views of a representative LED package 274 according to embodiments disclosed herein. The LED package 274 includes a light-altering material 276 as previously described that surrounds one or more LED chips 278-1 to 278-7. In certain embodiments, the light-altering material 276 is a rigid material that also provides mechanical support for the LED package 274. In certain embodiments, the light-altering material 276 forms an opening 280 to provide a primary emission direction for the LED package 274. FIG. 15A is a perspective view of the LED package 274 with dashed arrows indicating the primary emission direction of light through the opening 280. FIG. 15B is a side view of the LED package 274 taken from the primary emission direction. An optical material 281 as previously described is arranged in the opening 280 and at least partially surrounds the one or more LED chips 278-1 to 278-7. Depending on the composition of the optical material 281, the one or more LED chips 278-1 to 278-7 may or may not be visible though the opening 280. The one or more LED chips 278-1 to 278-7 include a first face 282 and a second face 284 as previously described. For simplicity, only the first face 282 and the second face 284 of the LED chip 278-1 are labeled in FIG. 15B. As illustrated, the light-altering material 276 surrounds the one or more LED chips 278-1 to 278-7 on the first face 282, the second face 284, and on all sides except for the one proximate the primary emission direction from the LED package 274. In this regard, the opening 280 is perpendicular to the second face 284 and the primary light emission direction is substantially parallel to the second face 284 of the one or more LED chips 278-1 to 278-7 as previously described. FIG. 16 illustrates a top view of a lighting device 286 that includes the LED package 274 of FIGS. 15A and 15B. The lighting device 286 includes a light guide 288 that may be used to backlight an LCD display or provide lighting for a general illumination lighting fixture. The LED package 274 is positioned along an edge 290 of the light guide 288 in such a manner that the primary emission direction (illustrated as dashed arrows) of the LED package 274 is directed into the light guide 288 from the edge 290. In certain embodiments, the LED package 274 or the light guide 288 may include one or more alignment features 292 configured to align the LED package 274 to the edge 290 of the light guide 288. Additionally, the LED package 274 may comprise a module that includes additional features, such as driver electronics, optics, filters, and other form or fit features to assist in the assembly of the lighting device 286.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED) package, comprising:
  one or more LED chips comprising a first face, a second face, and a plurality of sidewalls therebetween;
  a light-altering material that surrounds the first face, the second face, and at least one sidewall of the plurality of sidewalls; and
  a package anode pad and a package cathode pad arranged to electrically connect with the one or more LED chips from the second face, wherein a portion of the light-altering material is arranged between the one or more LED chips and the package anode pad and the package cathode pad.

2. The LED package of claim 1, wherein a primary emission direction of the LED package is substantially parallel to the second face.

3. The LED package of claim 1, wherein the light-altering material surrounds the first face, the second face, and at least three sidewalls of the plurality of sidewalls.

4. The LED package of claim 1, wherein any material that is on the first face or on the second face is devoid of a lumiphoric material.

5. The LED package of claim 1, wherein the light-altering material is an integral single component around the first face, the second face, and the at least one sidewall of the plurality of sidewalls.

6. The LED package of claim 1, wherein the light-altering material comprises discontinuous segments that are joined together around the first face, the second face, and the at least one sidewall of the plurality of sidewalls.

7. The LED package of claim 1, wherein the light-altering material comprises a thinned light-altering material through which a portion of the one or more LED chips may be electrically connected.

8. A lighting fixture comprising the LED package of claim 1, wherein the LED package is configured to provide illumination to an edge of a light guide.

9. The LED package of claim 1, wherein the light-altering material comprises at least one of a light-reflective particle, a light-refractive particle, or an opaque particle.

10. A light emitting diode (LED) package, comprising:
one or more LED chips comprising a first face, a second face, and a plurality of sidewalls therebetween, wherein the one or more LED chips are mounted in the LED package on either the first face or the second face and a primary emission direction of the LED package is substantially parallel to the second face;
a first light-altering material on the first face and a second light-altering material on the second face; and
a package anode pad and a package cathode pad arranged to electrically connect with the one or more LED chips from the second face, wherein a portion of the second light-altering material is arranged between the one or more LED chips and the package anode pad and the package cathode pad.

11. The LED package of claim 10, further comprising a lumiphoric material arranged on a first sidewall of the plurality of sidewalls.

12. The LED package of claim 10, wherein the first light-altering material comprises at least one of a light-reflective particle, a light-refractive particle, or an opaque particle.

13. The LED package of claim 10, wherein the first light-altering material extends toward the second light-altering material along at least one sidewall of the plurality of sidewalls.

14. The LED package of claim 10, wherein the first light-altering material surrounds the one or more LED chips on three sidewalls of the plurality of sidewalls.

15. The LED package of claim 10, further comprising a superstrate configured to mechanically support the one or more LED chips from the first face.

16. The LED package of claim 15, wherein the superstrate comprises the first light-altering material as a dispersion of particles.

17. The LED package of claim 15, wherein the first light-altering material is arranged in one or more layers on the superstrate.

18. The LED package of claim 10, wherein the package anode pad and the package cathode pad are electrically connected with a corresponding chip anode pad and a corresponding chip cathode pad of the one or more LED chips.

19. The LED package of claim 10, wherein the LED package is configured as a surface mount device having an overall thickness in a range of about 0.06 mm to about 0.25 mm.

20. The LED package of claim 10, further comprising a submount wherein the one or more LED chips are mechanically attached to the submount from the second face of the one or more LED chips.

21. The LED package of claim 20, wherein the package anode pad and the package cathode pad that are electrically connected to the one or more LED chips by one or more traces on a surface of the submount and a plurality of vias that extend through the submount.

22. The LED package of claim 20, further comprising one or more wirebonds that are electrically connected with the one or more LED chips, wherein the one or more wirebonds extend into the first light-altering material.

23. A light emitting diode (LED) package, comprising:
an LED chip comprising a first face, a second face, and a plurality of sidewalls therebetween;
a superstrate configured to mechanically support the LED chip from the first face;
a chip anode pad and a chip cathode pad on the second face; and
a package anode pad and a package cathode pad arranged to electrically connect with the chip anode pad and the chip cathode pad from the second face;
wherein the superstrate is configured to redirect light from the LED chip toward a primary emission direction of the LED package that is substantially parallel to the second face.

24. The LED package of claim 23, wherein an overall thickness of the LED package is in a range of about 0.06 mm to about 0.25 mm.

25. The LED package of claim 23, wherein the superstrate comprises a light-altering material as a dispersion of particles.

26. The LED package of claim 23, further comprising a light-altering material arranged in one or more layers on the superstrate.

27. A method of forming a light emitting diode (LED) package, the method comprising:
providing an LED chip comprising a first face, a second face, and a plurality of sidewalls therebetween;
mounting the second face of the LED chip to a surface of the LED package, wherein a primary emission direction of the LED package is substantially parallel to the second face;
forming an optical material to cover the LED chip; and
removing a portion of the optical material over the LED chip.

28. The method of claim 27, wherein removing the portion of the optical material over the LED chip exposes one or more electrically conductive paths on the LED chip for the LED chip.

29. The method of claim 28, wherein the one or more electrically conductive paths comprises at least one of an electrically conductive pedestal, a bump bond, a solder material, a wire, or a via.

30. The method of claim 29, further comprising forming a light-altering material to cover the optical material, the LED chip and the one or more electrically conductive paths.

31. The method of claim 30, further comprising removing a portion of the light-altering material to expose the one or more electrically conductive paths.

32. The method of claim 31, wherein removing the portion of the light-altering material comprises one or more steps of planarization, grinding, polishing, and thinning.

* * * * *

UNITED STATES PATENT AND TRADEMARK OFFICE
CERTIFICATE OF CORRECTION

| | |
|---|---|
| PATENT NO. | : 10,651,351 B1 |
| APPLICATION NO. | : 16/189195 |
| DATED | : May 12, 2020 |
| INVENTOR(S) | : Christopher P. Hussell |

It is certified that error appears in the above-identified patent and that said Letters Patent is hereby corrected as shown below:

In the Claims

Claim 21, Column 22, Lines 1-3, replace "wherein the package anode pad and the package cathode pad that are electrically connected" with --wherein the package anode pad and the package cathode pad are electrically connected--.

Signed and Sealed this
Twenty-third Day of June, 2020

Andrei Iancu
*Director of the United States Patent and Trademark Office*